United States Patent
Boyd et al.

(10) Patent No.: US 8,080,832 B1
(45) Date of Patent: Dec. 20, 2011

(54) SEMICONDUCTOR DEVICE FOR ELECTROSTATIC DISCHARGE PROTECTION

(75) Inventors: Graeme B. Boyd, North Vancouver (CA); Xun Cheng, Chengdu (CN); Ariel D. E. Sibley, Coquitlam (CA)

(73) Assignee: PMC-Sierra US, Inc., Sunnyvale, CA (US)

( * ) Notice: Subject to any disclaimer, the term of this patent is extended or adjusted under 35 U.S.C. 154(b) by 334 days.

(21) Appl. No.: 12/242,225

(22) Filed: Sep. 30, 2008

(51) Int. Cl.
*H01L 29/76* (2006.01)

(52) U.S. Cl. ........................ 257/173; 257/355

(58) Field of Classification Search .................. 257/536, 257/537, 173, 355
See application file for complete search history.

(56) References Cited

U.S. PATENT DOCUMENTS

| | | | |
|---|---|---|---|
| 5,012,317 A | 4/1991 | Rountre | |
| 5,773,335 A | 6/1998 | Chao | |
| 5,828,110 A | 10/1998 | Wollesen | |
| 5,864,162 A * | 1/1999 | Reedy et al. | 257/379 |
| 6,043,522 A | 3/2000 | Nakajima et al. | |
| 6,190,954 B1 | 2/2001 | Lee et al. | |
| 6,228,726 B1 | 5/2001 | Liaw | |
| 6,236,087 B1 | 5/2001 | Daly et al. | |
| 6,614,078 B2 | 9/2003 | Lee et al. | |
| 6,621,673 B2 | 9/2003 | Lin et al. | |
| 7,019,377 B2 | 3/2006 | Tsuchiko | |
| 7,034,363 B2 | 4/2006 | Chen | |
| 7,098,509 B2 | 8/2006 | Zdebel et al. | |
| 2002/0153570 A1 | 10/2002 | Lin et al. | |

OTHER PUBLICATIONS

Sedra/Smith "Microelectroinics circuits" fifth edition New York Oxford press p. A-8.*
Troutman, Ronald R., "Latchup in CMOS Technology: The Problem and Its Cure," 1986, pp. 7-15, 165-196, Kluwer Academic Publishers, Hingham, MA.

* cited by examiner

*Primary Examiner* — Eugene Lee
(74) *Attorney, Agent, or Firm* — Dennis R. Haszko

(57) ABSTRACT

The invention provides an electrostatic discharge (ESD) protection device for protecting the internal circuitry of an integrated circuit chip from ESD current. The device includes a natively doped substrate having high resistance. A first well is formed in the substrate including a discharge circuit. A second well is formed in the substrate separated from the first well by the width of a natively doped region. The natively doped region has the same connectivity type and substantially the same doping profile as the substrate. During an ESD event, current leaking through the natively doped region between the discharge circuit and the second well creates a voltage that triggers the discharge circuit when reaching its trigger voltage. The resistance ratio between the natively doped region and the well is about 10 times or greater. The high resistance of the natively doped region can achieve the trigger voltage with a smaller ESD current leaking through, which decreases the size of the ESD protection device and increases its performance and sensitivity. Thus, the invention provides for more robust and cost effective ESD protection devices.

19 Claims, 11 Drawing Sheets

710

710

710

710

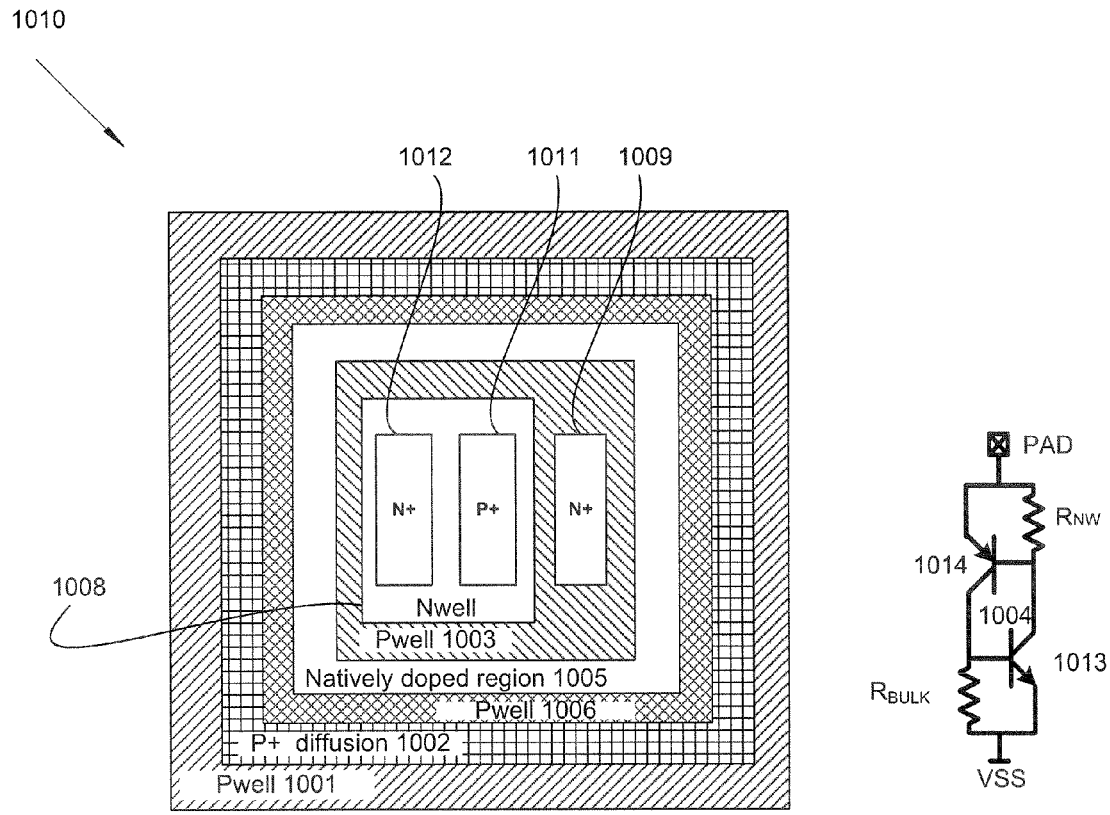
Figure 10a
Figure 10c
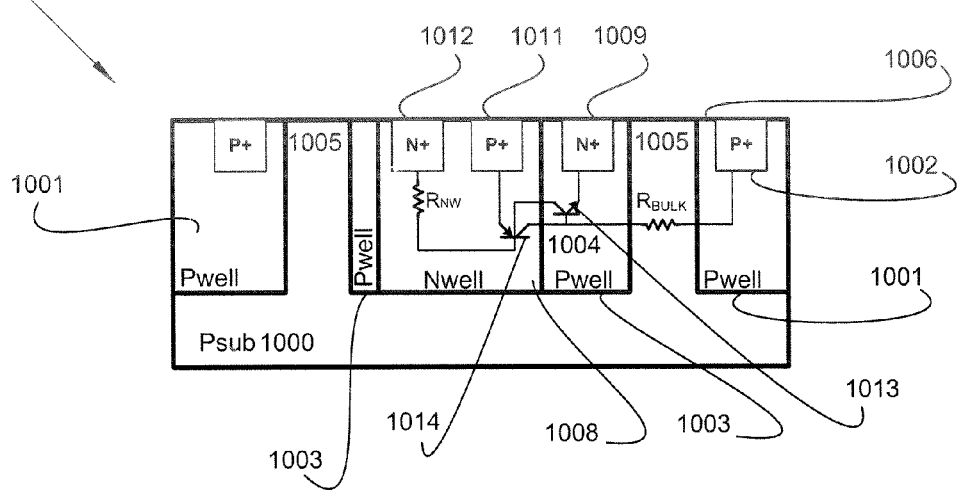
Figure 10b

SEMICONDUCTOR DEVICE FOR ELECTROSTATIC DISCHARGE PROTECTION

CROSS REFERENCE TO RELATED APPLICATIONS

This application is related to U.S. patent application Ser. No. 12/242,413 filed on Sep. 30, 2008, and entitled "A SEMI-CONDUCTOR DEVICE FOR LATCH-UP PREVENTION" which is incorporated herein by reference in its entirety.

FIELD OF THE INVENTION

The present invention relates to an electrostatic discharge protection device. In particular, the present invention relates to a semiconductor device for protecting integrated circuits from extreme ESD conditions.

BACKGROUND OF THE INVENTION

Electrostatic Discharge (ESD) is a major source of reliability failures in integrated circuits (ICs). ESD arises when electrostatic charge accumulated in an object, such as a human body or a piece of equipment, is conducted and discharged into a second object, such as a circuit board or IC. This conduction of charge often results in damage to ICs, whether through electrical over-voltage stress or through thermal stress caused by large currents.

The severity of an ESD event can often be reduced by reducing the potential for electrostatic charge to build up, by controlling humidity in lab environments. However, the potential can never be completely mitigated. As a result, ICs are required to incorporate ESD protection structures, allowing them to tolerate a certain level of ESD in order to avoid reliability hazards.

FIG. 1 illustrates a conventional ESD protection circuit 100 of a device incorporating an input/output (I/O) circuitry 101, a single positive power supply $V_{DD}$ 102, and a negative power supply $V_{SS}$ 103. A signal 104 is protected to both $V_{DD}$ and $V_{SS}$ by primary positive and negative clamp structures 105 and 106, respectively. A series resistor $R_{ESD}$ and secondary positive and negative clamps 107 and 108 further reduce the voltage at the I/O circuitry 101. The I/O circuitry 101 is connected to the device core circuitry 109. A power clamp 110 is placed between the $V_{DD}$ and $V_{SS}$ rails. The schematic shown in FIG. 1 shows all the major components used in an ESD protection circuit 100. However, it is known to someone skilled in the art that not all ESD protection circuits include all of these components. More complex strategies involving multiple positive and/or negative supply rails require more components.

The intention of the various clamps 105 to 108 shown in FIG. 1 is to shunt any ESD current seen at any pin away from the I/O 101 and core circuitry 109, providing a low-impedance path through the device, thereby avoiding any over-voltage stress on the I/O 101 and core circuitry 109. At the same time, the clamps must be designed appropriately such that they can handle the ESD current and are not themselves damaged by thermal over-stress caused by the large ESD currents.

The inclusion of an ESD protection circuit into an IC has a significant cost, both in area and cost of manufacturing, as well as in performance, i.e. speed and signal integrity. The area and cost issues are caused by the size of the various clamps used, which are often physically large. Accordingly, the ESD protection circuit constitutes a significant fraction of the total area of an integrated circuit. Therefore, the cost of the integrated circuit is directly impacted by the requirement for ESD tolerance. With regard to performance, the clamps act as parasitic capacitances due to their large size, which reduces the speed at which the signals to which they are attached can be driven. These parasitic capacitances can also cause signal integrity issues on signal traces due to increased reflections. As a result of both of these reasons, there is a significant incentive to reduce the size of the ESD clamps.

The simplest and arguably most common ESD structure commonly used for constructing ESD clamps is the diode. The diode is commonly built as a simple P-N junction (either a p-type diffusion in an n-well, or an n-type diffusion in a p-well). It is simple, has a very high current carrying capacity per unit area, and is easy to simulate. In many ways, the diode is the ideal clamp, but usually only in one direction. The other direction might also clamp depending on the type of diode. For example a Zener diode would clamp in both directions, but this is not commonly used in a CMOS process. As a result, most realizable ESD protection strategies that use diodes also require one or more of the other structures described earlier.

A first structure using MOS devices for ESD clamps, known as the "Big FET" approach, uses a trigger circuit to turn on a very large MOS device to conduct current during the ESD event. This approach has been used successfully to construct power clamps for many devices, and is particularly desired from a simulation perspective because no parasitic devices are involved, which therefore means that it can be simulated in a standard SPICE (Simulation Program with Integrated Circuit Emphasis)-compatible simulator. However, the MOS device is a surface conduction device, and its current carrying capacity is relatively small per unit area. As a result of this, the area required by the Big FET structure is often significantly larger than that required for either the snapback or Silicon-Controlled Rectifier (SCR) structures described below.

A "snapback" device is used in MOS devices, and makes use of the parasitic lateral NPN bipolar device that is inherent to all NMOS devices. FIG. 2 illustrates an NMOS device 200 with parasitic NPN device 201. The base 202 of the NPN is the bulk B of the NMOS device, while the emitter 203 and collector 204 of the NPN are source S and the drain D and of the NMOS device, respectively. During the ESD event, the parasitic NPN bipolar transistor 201 turns on, conducting the ESD current. This device can conduct a larger current per unit area than surface-conduction structures like the Big FET approach. The snapback device is advantageous because it can be made self-triggering and can also be used as the output device for standard CMOS I/O structures, thereby making "self-protecting" I/Os.

FIG. 3 shows a layout and cross sectional view of a snapback device in a reasonably advanced P-substrate CMOS technology with Shallow Trench Isolation (STI). N-type diffusions form the Drain 301 and Source 302 of the NMOS device, and are separated by Poly-silicon (usually called "poly") that forms the gate 303. A P-type diffusion forms the bulk tap 304, allowing connection to the P-well 305. The Pwell has low resistance, and it is electrically connected to the high-resistance P-sub 312 underneath. STI 311 separates the bulk tap 304 from the area of the drain 301, source 302, and gate 303. Metallic contacts 306, 307, and 308 connect to the Drain 301, Source 302, and Bulk tap 304, allowing connection to the rest of the circuit. A parasitic NPN transistor 309 is a bulk device formed from the Drain, Bulk and Source of the NMOS device (shown in FIG. 2), while the parasitic resistance 310 connects the base of the NPN device to the bulk tap 304.

FIG. 4 illustrates an idealized I-V curve of the NMOS snapback device of FIG. 3. During the ESD event, current discharged into the device suddenly increases the voltage on the Drain. This causes avalanche multiplication of current across the Drain/Bulk junction, which causes current to be injected into the substrate. This current in turn builds up a voltage across the parasitic resistance 310 (shown in FIG. 3) until the Bulk/Source junction becomes forward-biased, turning the NPN device on. This happens at a voltage and current given by $V_{T1}$ and $I_{T1}$, known as the snapback trigger point. After the NPN turns on, the voltage across the device drops to $V_H$, known as the Hold Voltage while current flows directly from the Drain to the Source. The avalanche multiplication current continues to flow, maintaining the snapback. As the current continues to increase, the voltage across the device increases according to the device on resistance, $R_{ON}$. Eventually, the power dissipation within the device reaches the point ($V_{T2}$, $I_{T2}$) at which the heat generated by the ESD current causes thermal breakdown, also known as the second breakdown point. At this point, the device has reached its thermal limits, and undergoes destructive breakdown.

Several parameters define the ESD Region in which the ESD protection device must operate. First, the $V_H$ must be greater than the power rail voltage ($V_{DD}$) plus some margin. The amount of margin necessary is dependent on power supply tolerances and also conditions the circuit may be subjected to during product testing. The protection device must also clamp the voltage below the oxide breakdown voltage ($V_{MAX}$) throughout the duration of the ESD event. Furthermore, the protection must survive up to the desired ESD protection level ($I_{MAX}$). The locations of the various points in FIG. 4 are highly dependent upon several factors, including edge rate of the ESD event, dopant densities, physical dimensions, the circuitry connected to the gate, and the substrate resistance 310 (shown in FIG. 3).

FIG. 5a is a top view of a conventional ESD protection device including a snap-back device as a discharge circuit. One of the most fundamental ways of controlling snap-back hold voltage $V_H$ and $V_{T1}$ is by varying a space 500 between the discharge circuit and the tie-down diffusion of the well as shown in FIG. 5a. FIG. 5b is a cross sectional view of the ESD protection device shown in FIG. 5a. By controlling the space 500 between the tie-down diffusion 501 of Pwell 502 and the emitter 503 of the bipolar transistor 504, the $R_{BULK}$ resistance 505 can also be controlled. By increasing the space 500, which is part of the size of Pwell 502, the value of $R_{BULK}$ is increased. An increased $R_{BULK}$ allows for a greater voltage drop in the substrate for a given current, which has two beneficial effects. The first benefit is that the necessary $V_{BE}$ (Base-Emitter Voltage) for triggering the snapback can be more easily achieved, which can lower the $V_{T1}$ of the snapback. The second benefit is that, during snapback, the bipolar transistor will be turned on harder as the $V_{BE}$ will be raised further above the threshold voltage, which reduces the hold voltage $V_H$.

FIG. 6a illustrates a top view of another device commonly used for ESD clamps known as the Silicon-Controlled Rectifier (SCR). An example of such an SCR device is disclosed in U.S. Pat. No. 5,012,317. FIG. 6b is a cross sectional view of the SCR device shown in FIG. 6a. The discharge circuit in an SCR device includes two parasitic bipolar transistors, a PNP 600 and an NPN 601 as shown in FIG. 6b. The PNP bipolar transistor 600 is formed by P+ diffusion 602, Nwell 603, and Pwell 604. The NPN bipolar transistor 601 is formed by Nwell 603, Pwell 604, and N+ diffusion 605. The SCR device has a large current conduction ability that is potentially higher than snapback devices. FIG. 6c is circuit schematic illustrating the SCR circuit of FIG. 6b connected between a circuit pad and $V_{SS}$, when in operation.

Two of the important metrics to be optimized in an SCR device are the activation and holding voltages, which are directly analogous to the snap-back $V_{T1}$ and $V_H$ of FIG. 4. The activation and holding voltages of the SCR can be controlled by varying the space 606 shown in FIG. 6b to the tie-down diffusion 607 of Pwell 604. This in turn varies the resistance $R_{BULK}$ 608. A higher resistance corresponds to lower activation and holding voltages. Hence it is possible to reduce the activation and holding voltages by increasing the space to the Pwell pick-up.

Unlike the snapback device, the self-triggering voltage for a typical SCR is typically in the 10-20V range, which is too high for the majority of applications in fine-geometry ICs. In order to overcome this limitation, SCRs require a trigger circuit to turn on during the ESD event, which complicates the design significantly. In addition, SCRs normally require more simulation and testing than snapback devices, which also complicates their use.

The main problem with both the snapback and the SCR devices of the prior art is that the well resistance is so low, due to high doping, that a significant space is required to obtain a sufficient increase in $R_{BULK}$. As a result of this, increasing the performance of the ESD protection device would automatically impact the area of the device and the speed of the signal inputted to the IC.

It is, therefore, desirable to provide a structure that allows for increasing the sensitivity and performance of the ESD protection device without increasing its size.

SUMMARY OF THE INVENTION

It is an object of the present invention to improve the performance of ESD protection devices while reducing their size, which provides for more robust and cost effective devices.

Embodiments of the invention utilize natively doped regions to separate wells of the same connectivity type. The natively doped regions are regions that do not have any wells formed therein, and have the same connectivity type and substantially the same doping profile as the substrate. These regions have high resistance, and are able to achieve the desired resistance $R_{BULK}$ with a relatively smaller area as compared to the wells. The resistance ratio between the substrate and the wells is about 10 times or greater. The higher the resistance of the substrate, the less area is required to achieve the resistance $R_{BULK}$.

In an aspect, the present invention provides a semiconductor ESD protection device including a substrate, a first well, a discharge circuit formed in the first well, a second well, and a natively doped region provided between the first well and the second well. The discharge circuit is formed in the first well to create a discharge path for the electrostatic current generated during an ESD event. The natively doped region has a resistance at least about 10 times higher than the resistance of the wells such that when current passes through during the ESD event, the voltage across the natively doped region triggers the discharge circuit. The voltage is proportional to the width of the natively doped region. The substrate, the natively doped region, and the first and second wells are of a first connectivity type, and the substrate and the natively doped region have substantially the same doping.

The second well can include a diffusion of the same connectivity type. The diffusion can either be formed adjacent the natively doped region or separated therefrom by the width of a third well of the first connectivity type. The natively doped region and the wells can be ring shaped. Alternatively, the natively doped region can be provided in the form of strips. The natively doped region can be an epitaxial layer.

The discharge circuit provided in the first well can include two implanted regions of a second connectivity type opposite the first connectivity type. The first well can include a plurality of discharge circuits. The first and second connectivity types can either be P type and N type, or N type and P type, respectively.

In an embodiment directed to a snap-back device, the two implanted regions are diffusions, and the discharge circuit is a parasitic bipolar device dominantly of the second connectivity type. The parasitic bipolar device can be formed under a MOS structure. When in operation, the ESD protection device can further include a fixed potential drop element e.g. a diode, placed in series with the discharge circuit for increasing either or both of the holding and trigger voltages to an operable value.

In another embodiment directed to an SCR device, one of the implanted regions is a diffusion and the other implanted region is a discharge circuit well of the second connectivity type. The diffusion of the discharge circuit defines a first bipolar transistor with the first well and the discharge circuit well. The first bipolar transistor can be dominantly of the second connectivity type. The third well can include one diffusion of the first connectivity type and another diffusion of the second connectivity type. The diffusion of the third well that is of the first connectivity type defines a second bipolar transistor dominantly of the first connectivity type with the first well and the discharge circuit well. The collector of the second bipolar transistor is connected to the base of the first bipolar transistor and vice versa.

In another aspect, the invention provides a semiconductor electrostatic discharge (ESD) protection device comprising a substrate, a first well formed in the substrate including a first diffusion, a second well formed in the substrate including a second diffusion, and a natively doped region separating the first and the second wells. The natively doped region has high resistance as compared to the first and the second wells. The ESD device also includes a third well formed in the second well including third and fourth diffusions. The substrate, the first and second wells, the natively doped region, the first and the third diffusions are of a first connectivity type, and the third well, the second and the fourth diffusions being of a second connectivity type. The second diffusion forms a first bipolar transistor dominantly of the second connectivity type with the second well and the third well. The third diffusion forms a second bipolar transistor dominantly of the first connectivity type with the third well and the second well. The collector of the second bipolar transistor is connected to the base of the first bipolar transistor and vice versa, thus forming silicon controlled rectifier that activates by a current leaking from the first well across the natively doped region in an ESD event.

In a further aspect, the invention provides a semiconductor electrostatic discharge (ESD) protection device comprising a substrate, a first well formed in the substrate including a first diffusion, a second well formed in the substrate including second and third diffusions, and a natively doped region separating the first and the second wells. The natively doped region has high resistance as compared to the first and the second wells. The substrate, the first and second wells, the natively doped region, and the first diffusion are of a first connectivity type, and the second and third diffusions are of a second connectivity type. The second and the third diffusions form a parasitic bipolar transistor dominantly of the second connectivity type, thus forming a snapback device that activates by a current leaking from the first well across the natively doped region in an ESD event.

BRIEF DESCRIPTION OF THE DRAWINGS

Embodiments of the present invention will now be described, by way of example only, with reference to the attached Figures, wherein:

FIG. 5b is a cross sectional view of the snap-back device of FIG. 5a;

FIG. 6b is a cross sectional view of the SCR device of FIG. 6a;

FIG. 7b is a cross sectional view of the ESD protection device of FIG. 7a;

FIG. 8 illustrates a preferred embodiment of the ESD protection device shown in FIG. 7a;

FIG. 9b is a cross sectional view of the device of FIG. 9a;

FIG. 10a is a top view of an embodiment of the invention in which the discharge circuit is an SCR device;

FIG. 10b is a cross sectional view of the device of FIG. 10a; and

FIG. 10c is circuit schematic showing the SCR circuit of FIG. 10b connected between a circuit pad and $V_{SS}$.

DETAILED DESCRIPTION

Generally, the present invention provides a method and a structure for controlling the activation and hold voltages of an ESD protection device, by increasing the $R_{BULK}$ resistance without increasing the size of the ESD protection device.

Embodiments of the invention provide an ESD protection device for protecting the internal circuitry of an integrated circuit chip from ESD current. The device includes a natively doped substrate having high resistance. A first well is formed in the substrate including a discharge circuit. A second well is formed in the substrate separated from the first well by the width of a natively doped region. The natively doped region has the same connectivity type and substantially the same doping profile as the substrate. During an ESD event, current leaking through the natively doped region between the discharge circuit and the second well creates a voltage that triggers the discharge circuit when reaching its trigger voltage. The resistance ratio between the natively doped region and the well is about 10 times or greater. The high resistance of the natively doped region can achieve the trigger voltage with a smaller ESD current leaking through, which decreases the size of the ESD protection device and increases its performance and sensitivity. Thus, embodiments of the invention provide for more robust and cost effective ESD protection devices.

As shown in FIGS. 5a to 6b, prior ESD protection devices include a discharge circuit formed in a Pwell. The $R_{BULK}$ resistance that controls the trigger and hold voltages of the ESD protection device is defined by the space (500 in FIGS. 5, and 606 in FIG. 6) between the discharge circuit and the P+ diffusion in the Pwell.

In order to increase the resistive value of resistance $R_{BULK}$, embodiments of the present invention utilize a substrate that is natively doped. The natively doped region has a lower concentration of implanted donor/acceptor atoms, thus has higher resistance as compared to the wells. The impedance increase can be observed over a wide range of frequencies from DC up to the GHz range.

In a different embodiment, an epitaxial (epi) layer or region (not shown) is provided on top of the substrate. The doping profile of the epi region can be the same as the doping profile of the substrate, or may be different. Hence, it is possible to form the wells in the epi region provided on top of the substrate. The wells can be provided all the way through the depth of the epi region or partially therein. Hence, in the case where epi is used, it is possible to use a natively doped epi to separate the discharge circuit formed in the first Pwell and the P+ diffusion of the second Pwell to provide the $R_{BULK}$ resistance.

Figure 1:
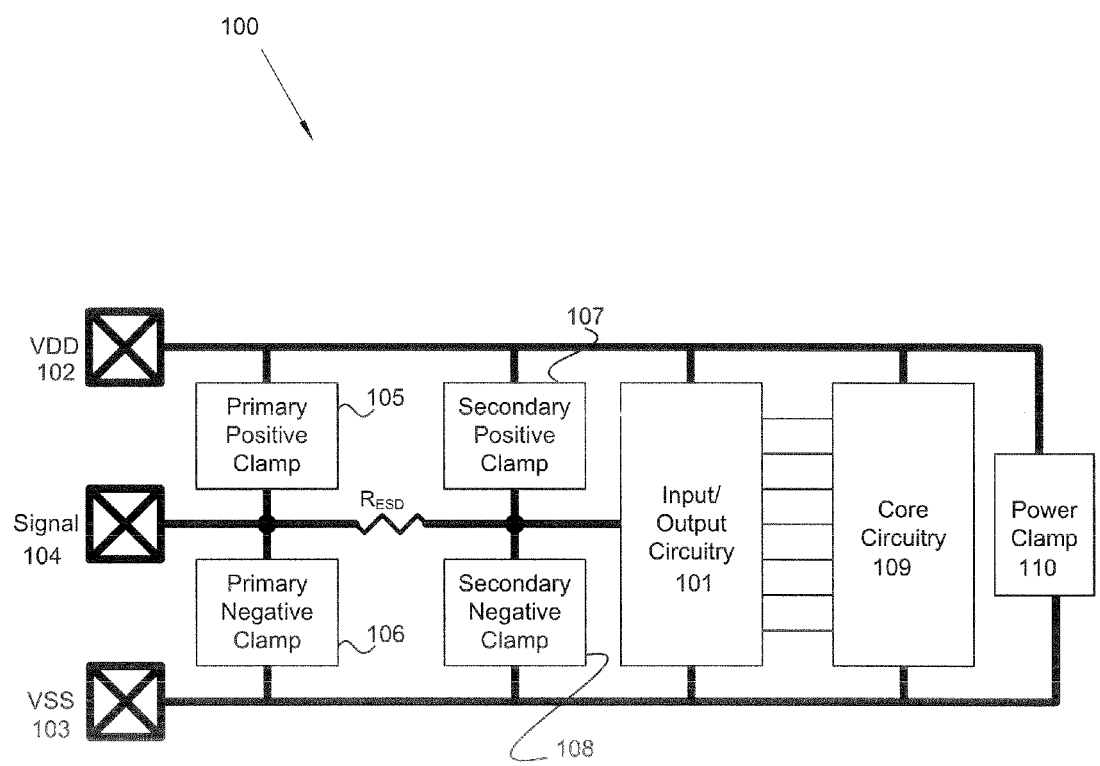
FIG. 1 illustrates a conventional ESD protection circuit of a device incorporating a single input/output (I/O)
Figure 2:
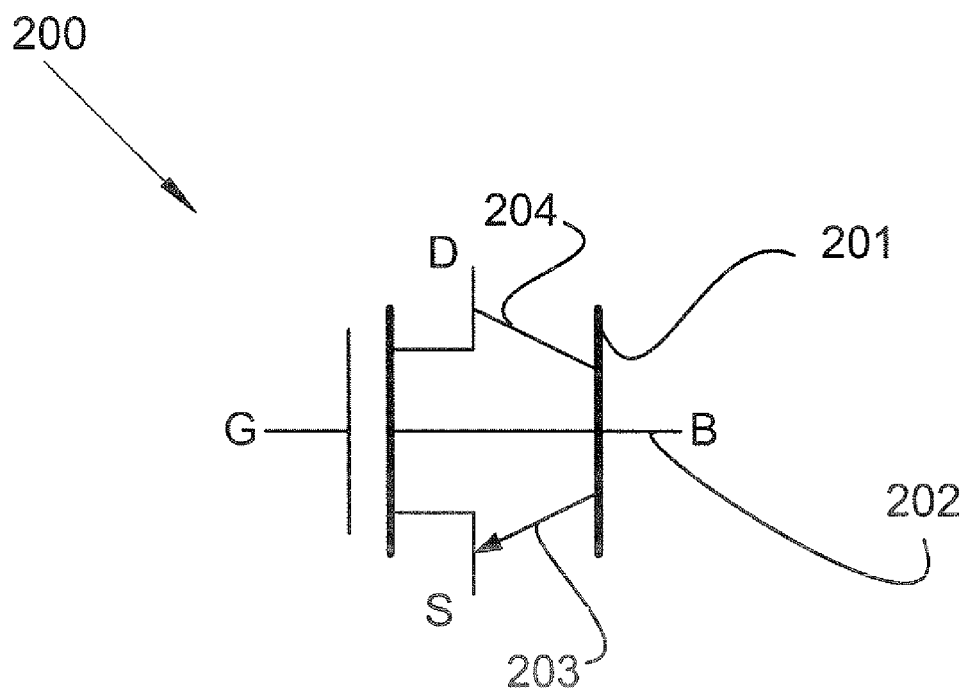
FIG. 2 is an NMOS device with parasitic NPN device.
Figure 3:
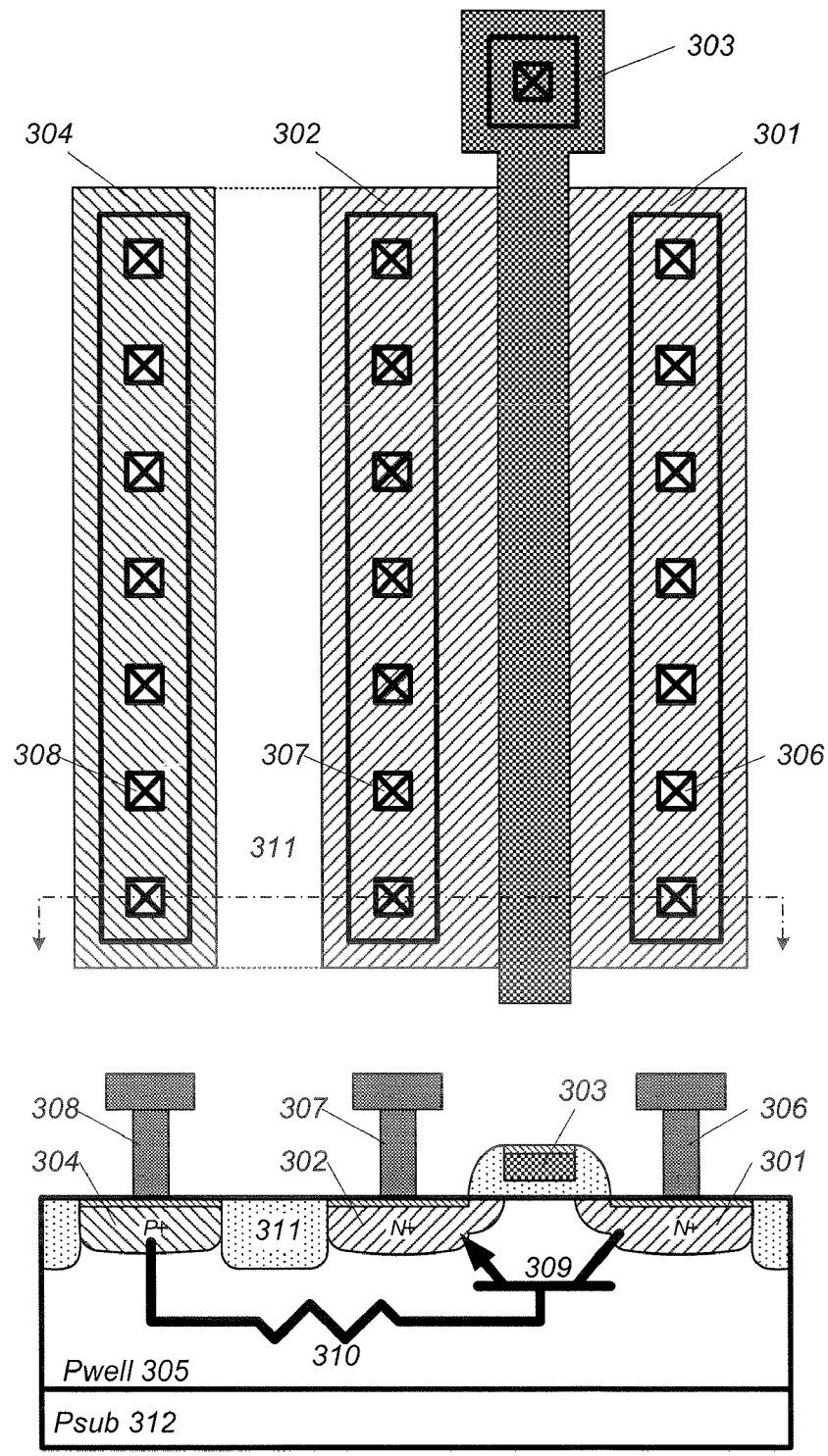
FIG. 3 is a layout and cross sectional view of a snapback device in a reasonably advanced P-substrate CMOS technology with Shallow Trench Isolation.
Figure 4:
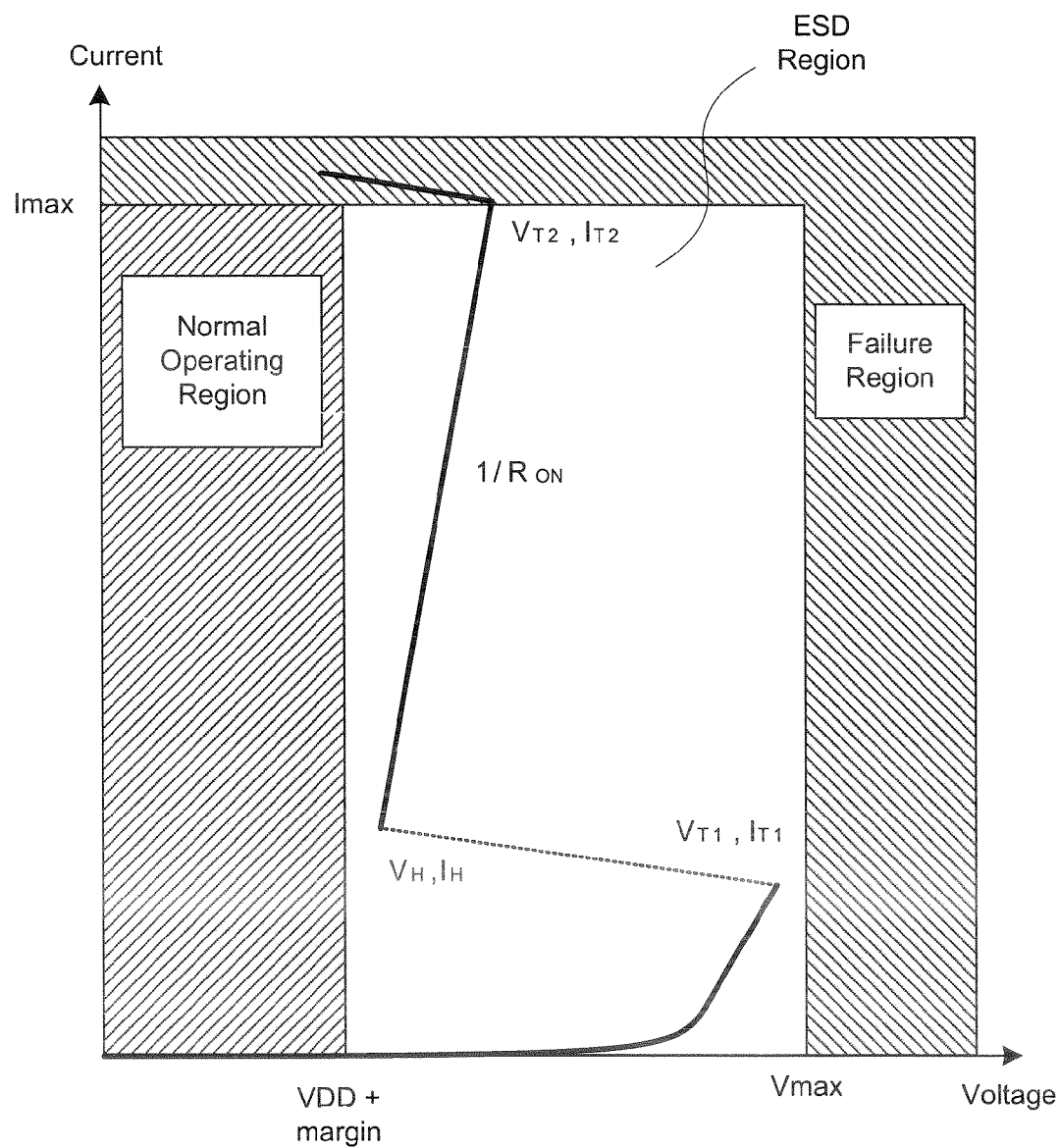
FIG. 4 is an idealized I-V curve of the NMOS snapback device shown in FIG. 3.
Figure 5A:
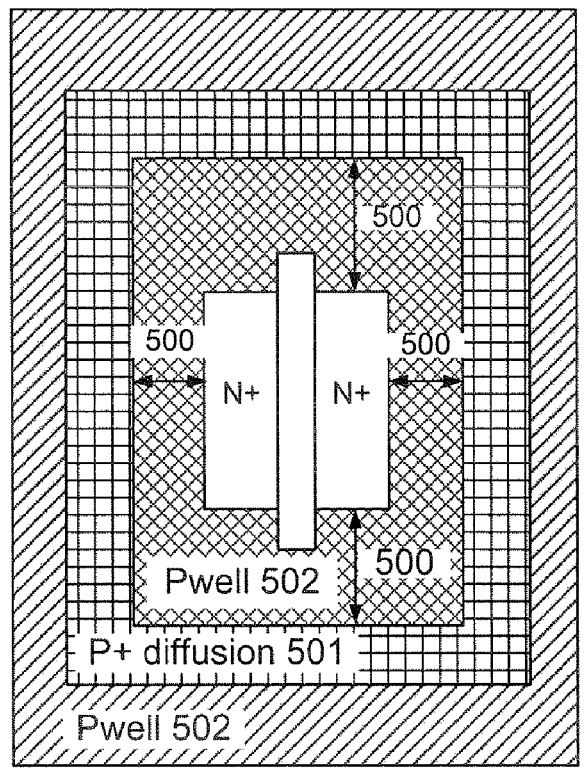
FIG. 5a is a top view of a conventional ESD protection device including a snap-back device.
Figure 5B:
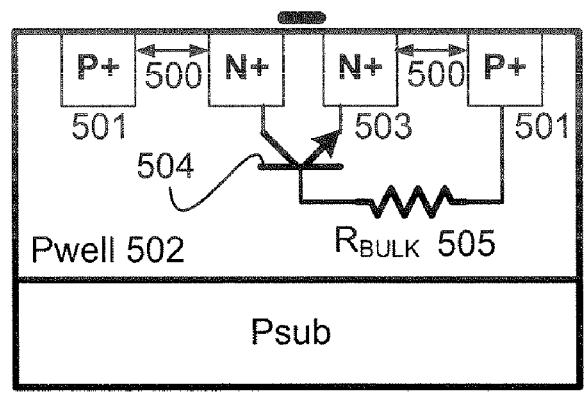
Figure 6A:
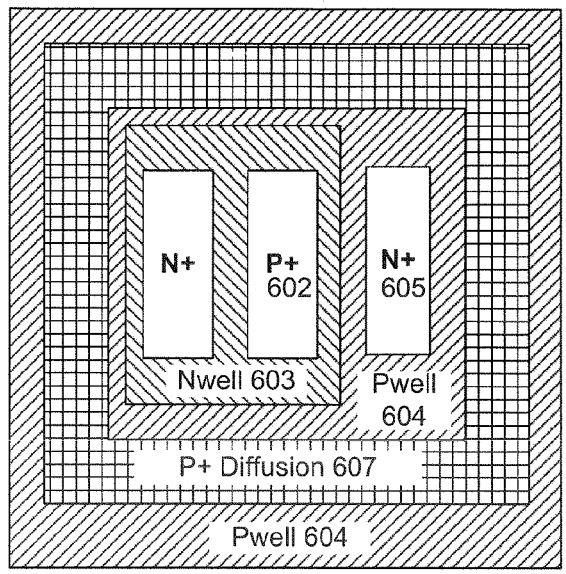
FIG. 6a is a top view of a conventional ESD protection device including an SCR device.
Figure 6B:
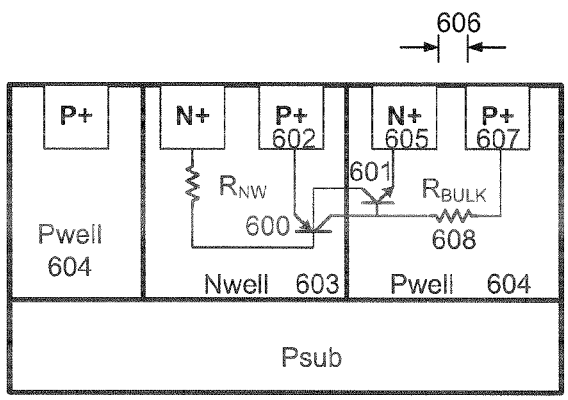
Figure 6C:
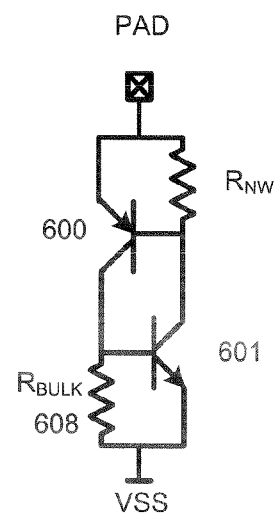
FIG. 6c is circuit schematic showing the SCR circuit of FIG. 6b connected between a circuit pad and $V_{SS}$.
Figure 7A:
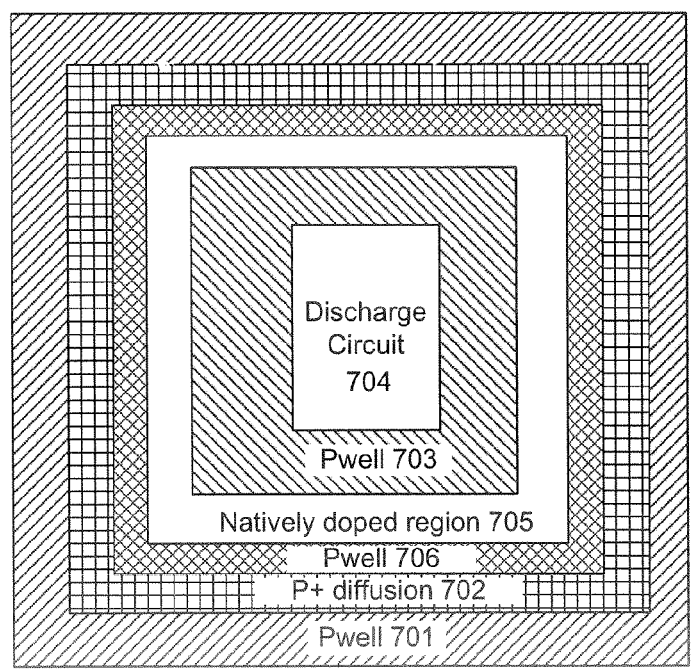
FIG. 7a is a top view of an ESD protection device in accordance with an embodiment of the present invention.
Figure 7B:
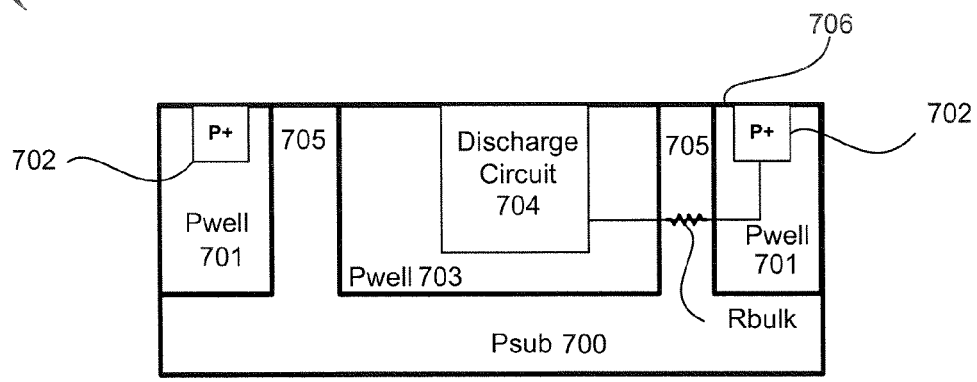

FIG. 7a is a top view of an ESD protection device 710 in accordance with an embodiment of the present invention. FIG. 7b is a cross sectional view of the ESD protection device 710 of FIG. 7a. The ESD protection device 710 can be used between two ports of an IC in order to protect the internal circuitry of the IC. According to the embodiment shown in FIGS. 7a and 7b, the ESD protection device 710 is formed on a natively doped substrate 700 having a high resistance. The ESD protection device 710 includes a first Pwell 701, and a second Pwell 703. The second Pwell 703 includes a discharge circuit 704 that creates a discharge path for the ESD current away from the internal circuitry of the IC. The first Pwell 701 can include a P+ diffusion 702 for connecting to a port of the IC. The first Pwell 701 is separated from the second Pwell 703 by a natively doped region 705. The natively doped region 705 is provided instead of or in addition to the Pwell space (500 in FIG. 5a and 606 in FIG. 6) in the prior art.

The natively doped region 705 is of the same material as the natively doped substrate 700 and has the same resistance value. The resistance of the natively doped region is high as compared to the low resistance of the wells. For example, the ratio of resistance of the natively doped region to the wells can be at least about 10 times higher. In an embodiment, it can be from about 10 times to about 100 times higher. In a further embodiment, the ratio can be at least about 100 times higher. The absolute resistance values do not matter as long as the relative values are within one or more of these ranges.

The natively doped region 705 acts as a resistor $R_{BULK}$ between the discharge circuit 704 and the P+ diffusion 702 of Pwell 701. Since the natively doped region 705 has a higher resistance than Pwells and Nwells, it is possible to achieve the desired resistance with a smaller space, as compared to the space needed to achieve the same resistance in a Pwell or Nwell. Accordingly, the limitation of the prior devices can be overcome and the sensitivity of the ESD protection devices can be improved by controlling the $V_H$ and $V_T$ voltages without increasing the size of the ESD protection device required.

The resistance $R_{BULK}$ which defines the voltage at the input of the discharge device 704 is directly proportional to the three-dimensional shape of the natively doped region 705. The trigger voltage V of the discharge circuit to be formed in the ESD protection device is pre-defined depending on the operating voltage of the internal circuitry of the IC. During an ESD event, current passing through the natively doped region 705 produces voltage across the resistance $R_{BULK}$. When this voltage reaches the trigger voltage of the discharge circuit 704, the discharge circuit 704 triggers and creates a discharge path for the electrostatic current away from the internal circuitry of the IC chip. The discharge circuit 704 can be triggered faster and the holding voltage can be reduced with a larger $R_{BULK}$, achieving the threshold voltage with a smaller current.

In the embodiment shown in FIGS. 7a and 7b, an optional third Pwell 706 separates the P+ diffusion 702 and the natively doped region 705 to ensure that the P+ diffusion 702 makes uniform contact with the Pwell 701. Pwell 706 can either be a separate well electrically connected to Pwell 701 and formed between the P+ diffusion 702 and the natively doped region 705, or can be a part of Pwell 701, in which case, P+ diffusion 702 is formed in Pwell 701 at a certain distance from the natively doped region 705.

Figure 7C:
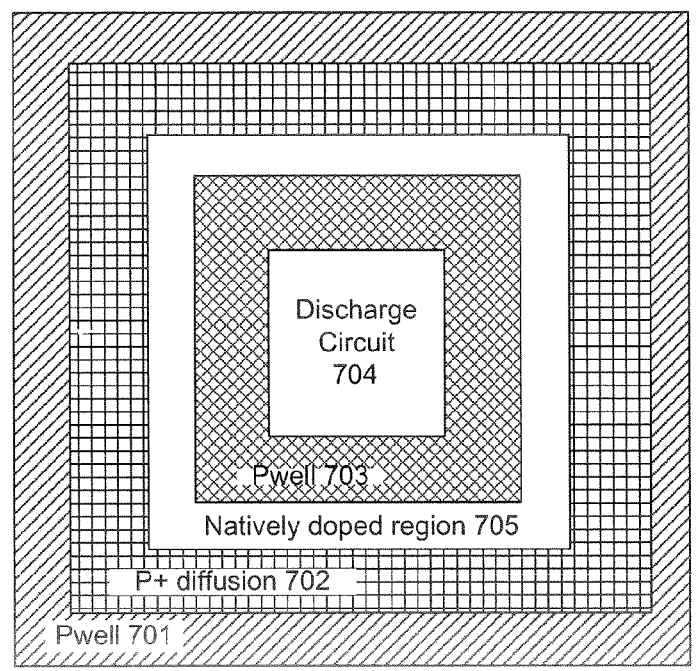
FIG. 7c is a top view of another embodiment of an ESD protection device in accordance with the present invention.
Figure 7D:
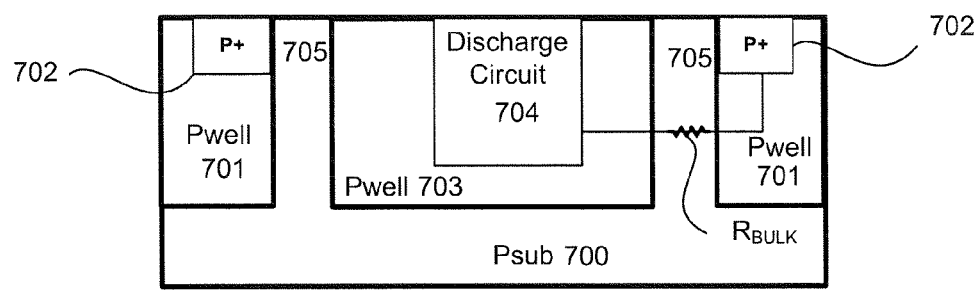
FIG. 7d is a cross sectional view of the ESD protection device of FIG. 7c.

FIG. 7c is a top view of another embodiment of an ESD protection device in accordance with the present invention, and FIG. 7d is a cross sectional view of the ESD protection device of FIG. 7c. FIGS. 7c and 7d show the P+ diffusion 702 formed adjacent to and in contact with the natively doped region 705. This is in contrast to FIG. 7a, which shows the P+ diffusion separated from the natively doped region 705 by the width of the third Pwell 706.

When the ESD protection device 710 is in operation to protect two ports of an IC, the discharge circuit 704 is connected to the two ports, and the Pwell 701 is connected to ground. Preferably, the Pwell is connected to ground by P+ diffusion 702. The discharge circuit 704 can be coupled between: an input port and $V_{DD}$; an input port and $V_{SS}$, $V_{DD}$ and $V_{SS}$; an internal node and one of $V_{DD}$ and $V_{SS}$; or between two internal nodes.

The use of the natively doped region 705 may in some instances reduce the holding voltage below safe levels ($V_{DD}$+ margin). In that case, a fixed potential drop element, such as a diode, can be used to increase the holding voltage back to safe levels.

Figure 8:
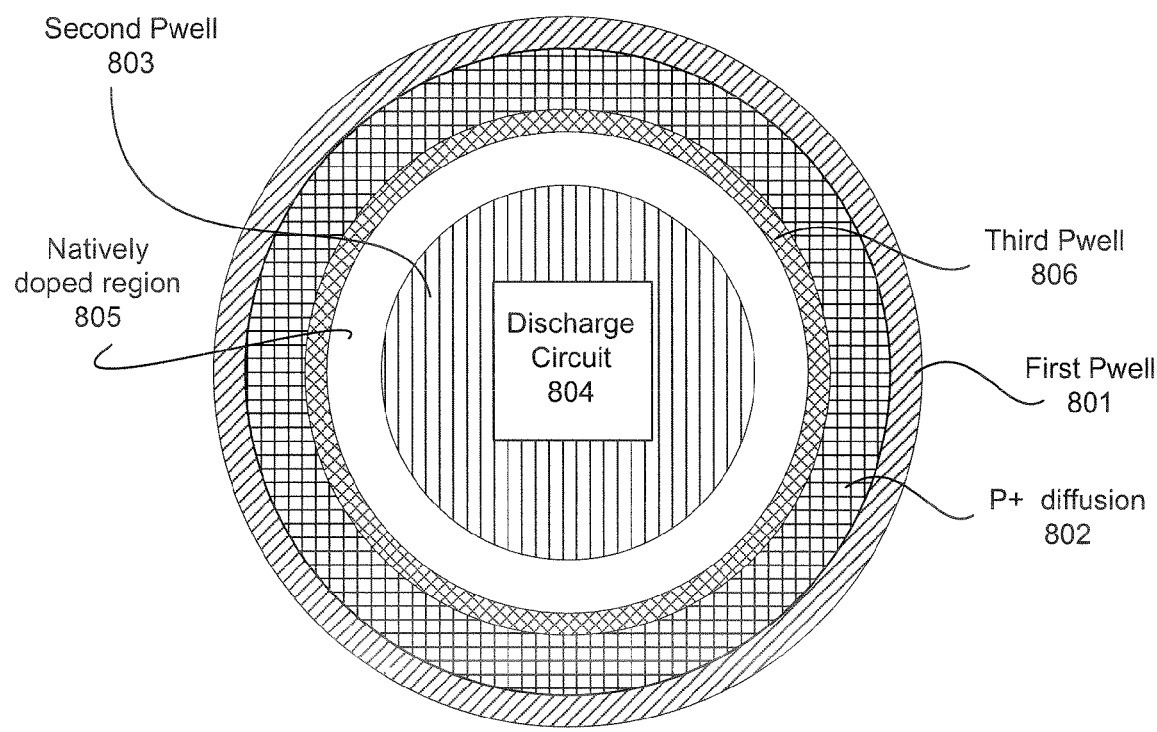

In contrast to the shape of the wells 701 and 703 and the natively doped region 705 as shown in FIGS. 7a to 7d, FIG. 8 shows that these elements can alternatively be provided in a ring shape. The provision of the natively doped region 805 in the form of a ring that surrounds the discharge device 804 is desired since it surrounds the discharge circuit 804 with a distributed resistance. In FIG. 8, Pwell 801, P+ diffusion 802, Pwell 803, discharge circuit 804, natively doped region 805, and Pwell 806 correspond to: Pwell 701, P+ diffusion 702, Pwell 703, discharge circuit 704, natively doped region 705, and Pwell 706 of FIGS. 7a and 7b.

In a further embodiment (not shown), the natively doped region can be provided as partial rings or strips that are sufficiently long relative to the size of the ESD discharge circuit. If the natively doped region is provided in the form of a strip between Pwells 701 and 703, these wells will be electrically connected to each other and form one well or one terminal. In yet a further embodiment, the natively doped region can be provided around the discharge circuit in any shape as long as it is continuous.

Figure 9A:
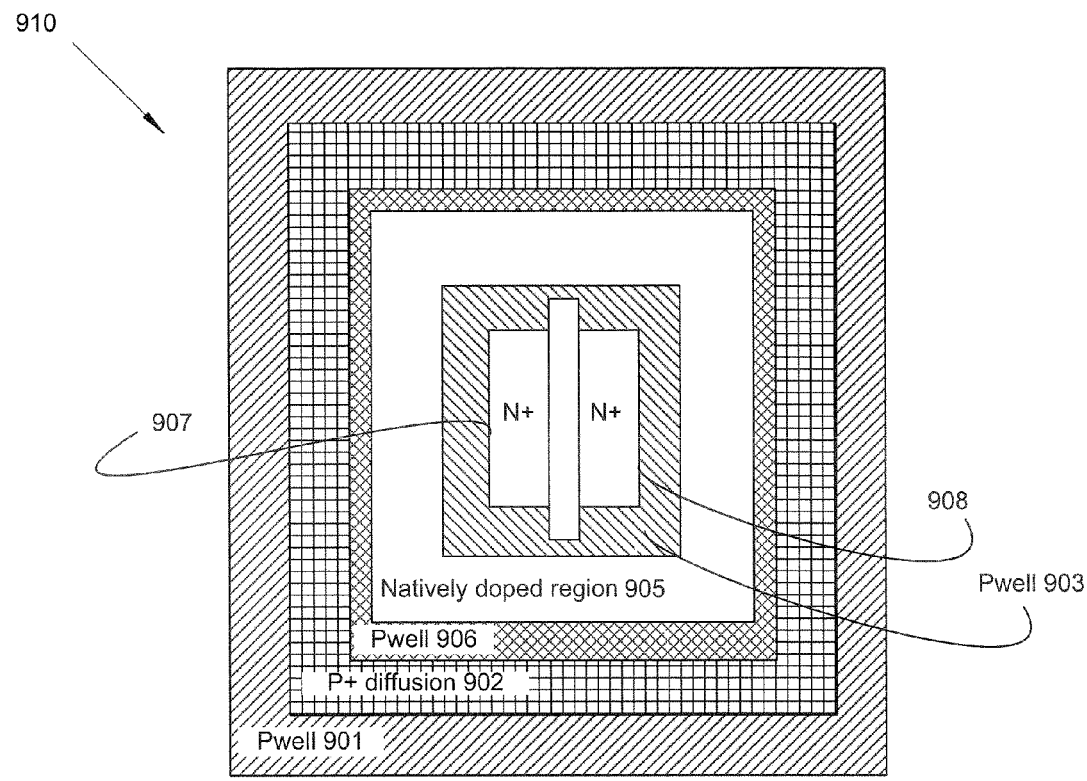
FIG. 9a is a top view of an embodiment of the invention in which the discharge circuit is a snap-back device.

FIG. 9a is a top view of an ESD protection device 910 illustrating another embodiment of the present invention.

Figure 9B:
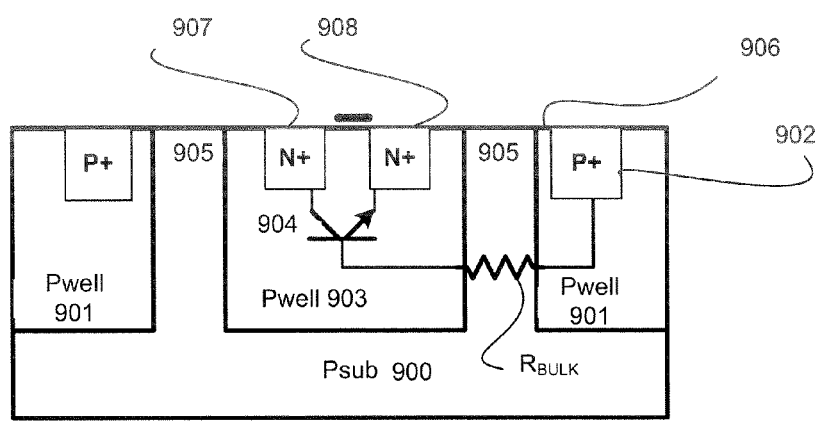

FIG. 9b is a cross sectional view of the ESD protection device of FIG. 9a. The discharge circuit illustrated in FIGS. 9a and 9b is a snap-back device 904 such as the device shown in FIGS. 5a and 5b. Pwell 903 corresponds to Pwell 703 of FIGS. 7a and 7b. Pwell 903 includes two implantations 907 and 908 of an opposite connectivity type. The parasitic NPN bipolar device 904 is formed by the Pwell 903 and implantations 907 and 908. In a preferred embodiment, the implantations are formed as N+ diffusions 907 and 908.

The embodiment shown in FIGS. 9a and 9b shows how natively doped regions 905 can be applied to reduce the holding voltage and trigger voltage of a snap-back device that is dominantly of the opposite doping type as the substrate. Since the substrate is P doped and the parasitic device is NPN, thus including two junctions of N and one junction of P, the parasitic device is considered to be dominantly of the opposite connectivity type of the substrate. In the embodiment of FIGS. 9a and 9b, the natively doped region 905 can be used to reduce the holding voltage $V_H$ and trigger voltage $V_T$ of the parasitic NPN inherent in an NMOS device. In FIGS. 9a and 9b, substrate 900, Pwell 901, P+ diffusion 902, Pwell 903, discharge circuit 904, natively doped region 905, and Pwell 906 correspond to: substrate 800, Pwell 801, P+ diffusion 802, Pwell 803, discharge circuit 804, natively doped region 805, and Pwell 806 of FIGS. 8a and 8b, respectively.

While the ESD protection device 910 shown in FIGS. 9a and 9b is for an NMOS in a P-type substrate, the device can be easily adapted to a PMOS in an N-type substrate. Furthermore, the outer terminals of the bipolar device need not be formed using a MOS structure. Any pair of diffusions and/or wells that are of the oppose type as the substrate can be used to achieve the desired result.

FIG. 10a is a top view of an ESD protection device 1010 illustrating a further embodiment of the invention. The discharge device 1004 illustrated in FIGS. 10a and 10b is an SCR device such as the device shown in FIGS. 6a to 6c. Pwell 1003 shown in FIGS. 10a and 10b corresponds to Pwell 703 of FIGS. 7a and 7b. Pwell 1003 includes two implantations of the opposite connectivity type. In a preferred embodiment, one of the implantations is a discharge circuit well such as Nwell 1008, and the other is N+ diffusion 1009. The Nwell 1008 includes two further implantations 1011 and 1012 of the opposite connectivity type to each other. In a preferred embodiment, implantations 1011 and 1012 are formed as P+ and N+ diffusions, respectively.

The SCR discharge device 1004 is formed by bipolar transistors NPN 1013 and PNP 1014. The NPN bipolar transistor 1013 is formed by N+ diffusion 1009, Pwell 1003, and Nwell 1008. The PNP bipolar transistor 1014 is formed by P+ diffusion 1011, Nwell 1008, and Pwell 1003. As illustrated in FIG. 10b, the base of the NPN bipolar transistor 1013 is connected to the collector of the PNP bipolar transistor 1014 and vice versa. The embodiment illustrated in FIGS. 10a and 10b shows how the natively doped region 1005 can be applied to increase the resistance $R_{BULK}$ between the base region of the SCR's NPN bipolar 1003 and the P+ diffusion 1002, thereby reducing the SCR's $V_H$ and $V_T$.

In FIGS. 10a and 10b, Substrate 1000, Pwell 1001, P+ diffusion 1002, Pwell 1003, discharge circuit 1004, natively doped region 1005, and Pwell correspond to: substrate 700, Pwell 701, P+ diffusion 702, Pwell 703, discharge circuit 704, natively doped region 705, and Pwell 706 of FIGS. 7a and 7b, respectively. The device 1010 shown in FIGS. 10a and 10b is for an SCR in a P-type substrate. However, this device could be easily adapted to an N-type substrate. FIG. 10c is circuit schematic showing the SCR circuit of FIGS. 10a and 10b connected between a circuit pad and Vss.

Calculation of the impedance value of a substrate or a well can be a difficult operation that depends on the three dimensional shape of the substrate or well and the conformity of doping throughout the substrate. The irregularity in the real shape of the substrate is also an additional factor that limits the preciseness of the measurement. However, the resistance of the natively doped substrate is at least about 10 times higher than the resistance of the wells, and thus requires less space to achieve a certain resistance value. In an embodiment, the ratio of resistance of the natively doped region to the wells can be from about 10 times to about 100 times higher. In a further embodiment, the ratio can be at least about 100 times higher.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention.

For instance, although FIGS. 7a to 10c illustrate only one discharge circuit, it is possible that the same natively doped region be used to provide $R_{BULK}$ resistance for a plurality of discharge circuits.

Additionally, FIGS. 7a to 10c and the preceding description illustrate the substrate and wells as being P doped regions, however the invention is not limited to only one type of doping. Someone of skill in the art would appreciate that the invention can still be practiced with N doped substrates and wells, without departing from the scope of the invention as defined in the appended claims.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A semiconductor electrostatic discharge (ESD) protection device comprising:
   a substrate having an upper portion and a lower portion;
   a first well and a second well formed in the upper portion of the substrate;
   a natively doped region in the upper portion of the substrate, between the first well and the second well, having substantially the same doping as the lower portion of the substrate;
   a discharge circuit formed in the first well to create a discharge path for the electrostatic current generated during an ESD event; and
   an ESD voltage trigger consisting of the natively doped region provided between the first well and the second well, the natively doped region having a resistance at least about 10 times higher than the resistance of the first and second wells such that when current passes through during the ESD event, a voltage across the ESD voltage trigger triggers the discharge circuit, the voltage being proportional to a width of the natively doped region;
   the substrate, the natively doped region and the first and second wells being of a first connectivity type, and the substrate and the natively doped region having substantially the same doping.

2. The device of claim 1, wherein the second well includes a diffusion of the same connectivity type.

3. The device of claim 2, wherein the second well further comprises a third well of the first connectivity type separating the diffusion of the second well and the natively doped region.

4. The device of claim 1, wherein the natively doped region is an epitaxial layer.

5. The device of claim 1, wherein the discharge circuit comprises two implanted regions of a second connectivity type opposite the first connectivity type.

6. The device of claim 5, wherein the first connectivity type is P type and the second connectivity type is N type.

7. The device of claim 5, wherein the first connectivity type is N type and the second connectivity type is P type.

8. The device of claim 1, further comprising a plurality of discharge circuits formed in the first well.

9. The device of claim 1, wherein the natively doped region is provided in the form of a ring around the first well, and wherein the wells are ring shaped.

10. The device of claim 1, wherein the natively doped region is provided in the form of one or more strips, and wherein the first and second wells are electrically connected to each other to form one well.

11. The device of claim 1, wherein the resistance of the natively doped region is in the range of 10 to 100 times higher than the resistance of the first and second wells.

12. The device of claim 1, wherein the resistance of the natively doped region is more than 100 times higher than the resistance of the first and second wells.

13. The device of claim 5, wherein the two implanted regions are diffusions, and the discharge circuit is a parasitic bipolar device dominantly of the second connectivity type, thus forming a snap-back device.

14. The device of claim 13, wherein the parasitic bipolar device is formed under a MOS structure.

15. The device of claim 13, further comprising a fixed potential drop element placed in series with the discharge circuit for increasing either or both of the holding and trigger voltages to an operable value.

16. The device of claim 15, wherein the fixed potential drop element is a diode.

17. The device of claim 5, wherein one of the implanted regions is a diffusion and the other implanted region is a discharge circuit well of the second connectivity type;
the diffusion of the discharge circuit defining a first bipolar transistor with the first well and the discharge circuit well, the first bipolar transistor being dominantly of the second connectivity type;
the discharge circuit well comprising one diffusion of the first connectivity type and another diffusion of the second connectivity type; and
the diffusion of the discharge circuit well that is of the first connectivity type defining a second bipolar transistor dominantly of the first connectivity type with the first well and the discharge circuit well, the collector of the second bipolar transistor being connected to the base of the first bipolar transistor and vice versa, thus forming a silicon controlled rectifier.

18. A semiconductor electrostatic discharge (ESD) protection device comprising:
a substrate having an upper portion and a lower portion;
a first well formed in the upper portion of the substrate including a first diffusion;
a second well formed in the upper portion of the substrate including a second diffusion;
a natively doped region in the upper portion of the substrate, between the first well and the second well, having substantially the same doping as the lower portion of the substrate;
an ESD voltage trigger consisting of the natively doped region separating the first and the second wells, the natively doped region having a resistance at least about 10 times higher than the resistance of the first and the second wells; and
a third well formed in the second well including third and fourth diffusions;
the substrate, the first and second wells, the natively doped region, the first and the third diffusions being of a first connectivity type, and the third well, the second and the fourth diffusions being of a second connectivity type;
the second diffusion forming a first bipolar transistor dominantly of the second connectivity type with the second well and the third well, the third diffusion forming a second bipolar transistor dominantly of the first connectivity type with the third well and the second well; the collector of the second bipolar transistor being connected to the base of the first bipolar transistor and vice versa, thus forming a silicon controlled rectifier that activates by a current leaking from the first well across the ESD voltage trigger in an ESD event.

19. A semiconductor electrostatic discharge (ESD) protection device comprising:
a substrate having an upper portion and a lower portion;
a first well formed in the upper portion of the substrate including a first diffusion;
a second well formed in the upper portion of the substrate including second and third diffusions;
a natively doped region in the upper portion of the substrate, between the first well and the second well, having substantially the same doping as the lower portion of the substrate; and
an ESD voltage trigger consisting of the natively doped region separating the first and the second wells, the natively doped region having a resistance at least about 10 times higher than the resistance of the first and the second wells;
the substrate, the first and second wells, the natively doped region, and the first diffusion being of a first connectivity type, and the second and third diffusions being of a second connectivity type; the second and the third diffusions forming a bipolar transistor dominantly of the second connectivity type, thus forming a snapback device that activates by a current leaking from the first well across the ESD voltage trigger in an ESD event.

* * * * *